United States Patent [19]

Oxley et al.

[11] Patent Number: 4,675,712
[45] Date of Patent: Jun. 23, 1987

[54] TRANSISTORS

[75] Inventors: Christopher H. Oxley, Towcester; Anthony J. Holden, Brackely, both of England

[73] Assignee: Plessey Overseas Limited, Ilford, England

[21] Appl. No.: 714,506

[22] Filed: Mar. 21, 1985

[30] Foreign Application Priority Data

Mar. 21, 1984 [GB] United Kingdom ............... 8407275

[51] Int. Cl.$^4$ .................... H01L 29/80; H01L 29/48; H01L 23/48; H01L 27/02
[52] U.S. Cl. ........................................ 357/22; 357/15; 357/68; 357/41
[58] Field of Search ................ 357/22 G, 22 S, 15, 357/68, 41

[56] References Cited

U.S. PATENT DOCUMENTS

| | | | |
|---|---|---|---|
| 3,516,021 | 6/1970 | Kohn | 357/22 |
| 3,737,743 | 6/1973 | Goronkin et al. | 357/22 |
| 4,065,782 | 12/1977 | Gray et al. | 357/22 |
| 4,107,720 | 8/1978 | Pucel et al. | 357/22 |
| 4,297,718 | 10/1981 | Nishizawa et al. | 357/22 |
| 4,536,942 | 8/1985 | Chao et al. | 357/15 |
| 4,549,197 | 10/1985 | Brehm et al. | 357/68 |

OTHER PUBLICATIONS

Plessey Allen Clarke Research Centre Annual Review 1984, pub. Jan. 85, "Travelling Wave Gallium Arsenide" by A. J. Holden and C. H. Oxley.
A. S. Podgorski and L. Y. Wei, Theory of Travelling Wave Transistors, IEEE Trans., ED.29, pp. 1845-1853, 1982, and references therein.
Y. Ayasli, L. D. Reynolds, J. L. Vorhaus and L. K. Hanes., 2-20 GH$_z$ GaAs Travelling Wave Amplifier. IEEE Trans., MTT 32. pp. 71-77, 1984.
E. W. Strid and K. R. Gleason, A DC-12 Monolithic GaAs FET Distributed Amplifier, IEEE Trans., MTT 30. pp. 969-975, 1982.

Primary Examiner—Martin H. Edlow
Assistant Examiner—Robert P. Limanek
Attorney, Agent, or Firm—Fleit, Jacobson, Cohn & Price

[57] ABSTRACT

A transistor having a support substrate of semiconductor material and continuous elongate electrodes—a source electrode a drain electrode and a gate electrode. Gain improvement is achieved by dividing the structure into active and passive sites and by providing inductive coupling to supply power feedback to the gate electrode and thereby to sustain and enhance guided wave propagation. At each active site, protrusions extend from the source electrode, and protrusions extend from the drain electrode. The parasitic capacitance at each passive site is thus minimized. The source and drain protrusions are connected by channels in the underlying semiconductor substrate and the conductivity of these channels controlled by gate operation. The drain electrode has a meander configuration to provide inductive coupling to the gate electrode and balance the waves on drain and gate. To reduce resistive losses, the gate electrode is of larger cross-section at passive sites. Also the gate electrode is of T-section shape at each active site. The upper extremity of this T-section may be offset towards the source electrode to increase breakdown threshold.

7 Claims, 5 Drawing Figures

TRANSISTORS

BACKGROUND OF THE INVENTION

1. Field of the Invention

The present invention relates to transistors, particularly travelling-wave field-effect transistors.

2. Description of Prior Art

A typical travelling-wave field-effect transistor comprises three continuous elongate parallel electrodes, namely a source electrode, a gate electrode and a drain electrode, adjacent to a layer of semiconductor material, this layer providing a common channel between the source and drain electrodes. In this construction a travelling-wave is generated and velocity coherence is maintained by means of distributed lumped capacitance. This latter is provided by a dielectric overlay and lateral conductors spaced apart along the length of the device, each being grounded by contact to the source electrode. Use of complex balun circuits is also typical and adds to the design complexity.

SUMMARY OF THE INVENTION

The present invention is intended to provide a travelling-wave field-effect transistor of simpler construction and, for a given gate width, one exhibiting an enhanced gain.

According to this invention there is thus provided a travelling-wave field-effect transistor comprising:
  a supportive substrate of semiconductor material;
  a continuous elongate source electrode;
  a continuous elongate gate electrode; and
  a continuous elongate drain electrode; and including;
  a plurality of lateral conductive channels underlying and spaced apart along the length of the gate electrode and extending between the source and drain electrodes, defining thus a plurality of distributed active sites; a inductive coupling between the drain and gate electrodes to provide feedback to sustain and enhance wave propagation.

Conveniently, the inductive coupling aforementioned may be provided by meander configuration of the drain electrode. The feedback of power from the drain electrode to the gate electrode compensates for loss in the gate electrode and assists in the generation of a growing wave. The longer drain line also balances the wave velocities on the drain and gate lines.

Preferably, the source electrode, or the drain electrode, or both, are provided with protruding portions, one at each active site. The consequent wider spacing of electrodes thus permitted at the passive sites, results in reduction of parasitic capacitance effects.

It is advantageous to configure the gate electrode to have greater cross-section area at the passive sites. This allows reduction of resistive losses along the gate electrode.

It is furthermore advantageous to configure the gate electrode to be of T-shaped cross-section at the active sites. This affords a thin region for gate operation, whilst at the same time providing a wider region to enhance conduction. It is preferable that this wider region is offset laterally relative to the thin region to lie closer to the source electrode. This latter construction has the advantage of improved breakdown characteristics.

BRIEF DESCRIPTION OF THE DRAWINGS

Embodiments of this invention will now be described, by way of example only, and with reference to the accompanying drawings in which.

DESCRIPTION OF THE PREFERRED EMBODIMENTS

Figure 1:
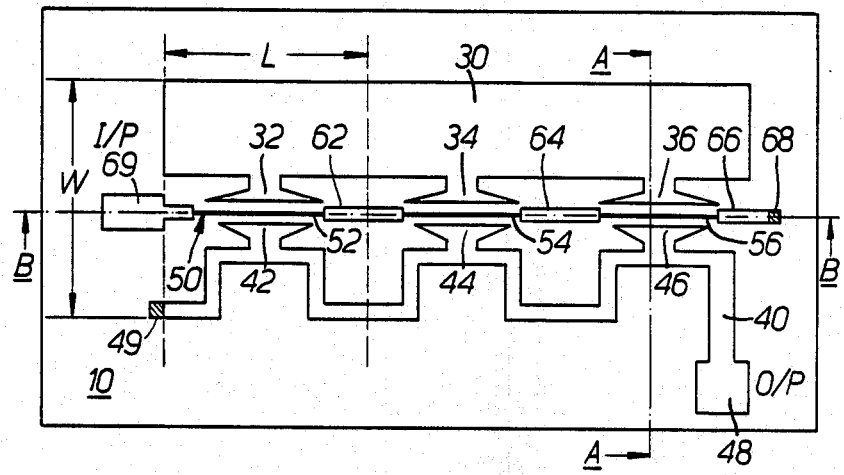
FIG. 1 is an outline plan view of a travelling-wave field-effect transistor constructed in accordance with this invention, and showing electrode configuration.
Figure 2:
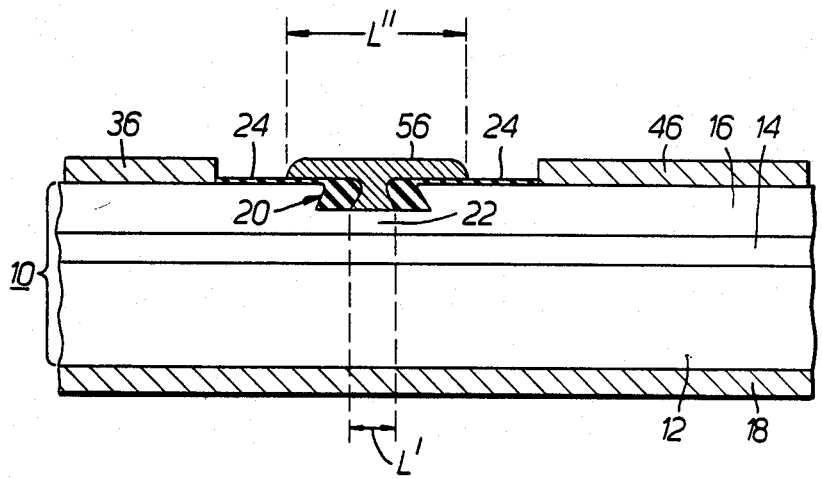
FIG. 2 is an expanded cross-section view of this transistor, taken along the section A—A of FIG. 1.
Figure 3:
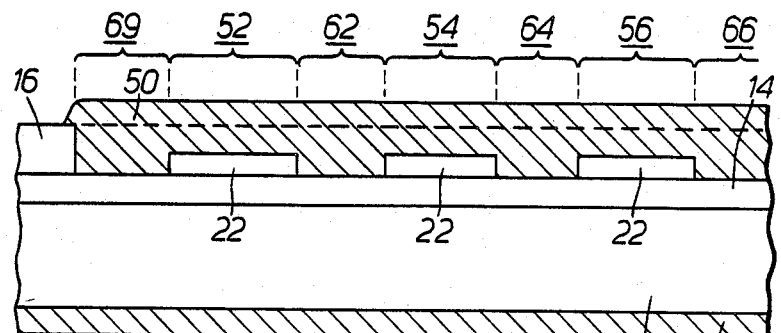
FIG. 3 is another cross-section view of this transistor, taken along the section B—B of FIG. 1.

With reference to FIGS. 1 to 3, there is shown a travelling-wave field-effect transistor. This comprises a composite semiconductor substrate 10 formed of a base substrate 12, a buffer layer 14 and an active layer 16. In this example the substrate 10 is of homogenous composition, but hybrid construction is not precluded and the buffer layer 14 can be of, for example, superlattice structure. A backing electrode metallisation 18 is formed on the underside of the base substrate 12. A groove 20 is defined along the length of the device. This groove 20 is configured so that at spaced intervals the groove is shallow. A channel 22 in the active layer 16 is thus left beneath the groove 20 at each of these sites. Elsewhere, the groove 20 is deeper and extends down to the buffer layer 14. The walls of this groove 20 and the upper surface of the active layer 16 adjacent to this groove 20 are coated with insulator material 24.

A continuous elongate source electrode 30 is formed on the surface of the active layer 16, and runs parallel to the groove 20. At spaced intervals along the length of this electrode 30, protruding regions 32,34 and 36 are provided. These are located at positions corresponding to the shallow groove sites.

A continuous elongate drain electrode 40 is formed on the surface of the active layer 16 on the opposite side of the groove 20. This also extends in a direction parallel to the groove 20 and is provided with protruding regions 42,44 and 46. These also are located at positions corresponding to the shallow groove sites and lie opposite the protrusions 32,34 and 36 of the source electrode 30. The protrusions 32,34,36,42,44 and 46 are shown as triangular in shape, but other shapes are not precluded. The drain electrode 40 is provided with an output termination 48, and a terminating impedance 49 at its front end.

A continuous elongate gate electrode 50 is provided between the source and drain electrodes 30,40. This is formed by metal deposited over the groove 20 and the insulating coating 24. Schottky contact gates 52,54 and 56 are formed, one at each shallow groove site, at the interface between this metal and the active layer 16 at the base of the groove 20. At these sites the cross-section of the gate electrode 50 is T-shaped. The vertical portion of the T defines a thin active stripe for controlling the conductivity of the underlying channel 22, whilst the horizontal portion of the T permits enhanced conduction along the gate electrode 50, thus reducing resistive losses. At other regions 62,64 and 66 of the gate electrode 50, the cross-section is wider and deeper—allowing yet further enhancement of conduction along the gate electrode 50. This gate electrode 50 is provided with a terminating impedance 68 and an input terminal 69.

It will be noted that the drain electrode 40 has a meander configuration. This is to provide inductive coupling between the drain electrode 40 and the gate electrode 50. It has been designed so that power feedback provided, from the drain electrode 40 to the gate electrode 50, sustains and enhances wave propagation along the device. The meander also balances the wave velocities on the drain and gate transmission lines.

The transistor described above thus comprises a plurality of distributed active sites. Each of these sites includes: a source region 32,34,36; a gate 52,54,56; and, a drain region 42,44,46. Channels 22 provide a controlled conduction path for carriers between each of the source regions and the corresponding drain regions, at each of these active sites.

In the foregoing example the substrate 10 is of III-V semiconductor material, gallium arsenide. Typical resistivity values for the base substrate material 12 and the buffer layer 14 are $10^6$–$10^7$ ohm·cm and $10^{12}$–$10^{13}$ ohm·cm respectively. The active layer is a vapour phase epitaxially grown layer of n-type gallium arsenide. This includes between 0.1 and $10 \times 10^{17}$ atoms/cc of donor dopant, either High dopant concentration being chosen for low noise performance, or a high dopant concentration being chosen for power performance.

Typical dimensions for the above transistor are given as follows:

Repeat pattern length L (FIG.1): 50 microns to 1.0 mm.
Pattern width W (FIG.1): 0.2 to 5.0 mm.
Minor gate length L' (FIG. 2): 0.15 to 1.5 microns.
Major gate length L" (FIG. 2): 1.0 to 5.0 microns.

The gate electrode 50 may be of high conductivity alloy, for example one of the titanium alloys: titanium aluminium, titanium nickel gold, titanium platinum gold, or titanium tungsten gold.

The source and drain electrodes 30, 40 are each formed from an ohmic contact in contact with the III-V semiconductor layer 16 and have a thick metallisation contact—preferably gold on top.

Figure 4:
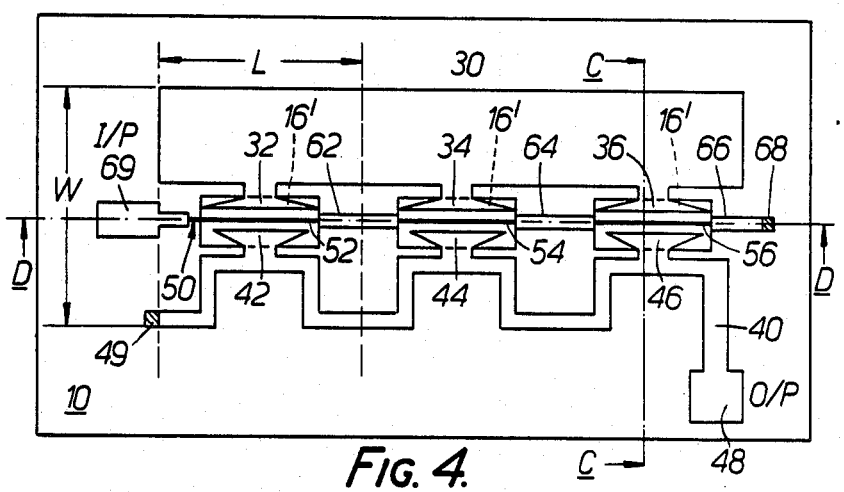
FIG. 4 is an outline plan view of a travelling-wave field-effect transistor, also constructed in accordance with this invention, a variant of the transistor shown in the preceding Figures.; and, FIG. 5 is an expanded cross-section view of this latter transistor, taken along section C—C of FIG. 4.
Figure 5:
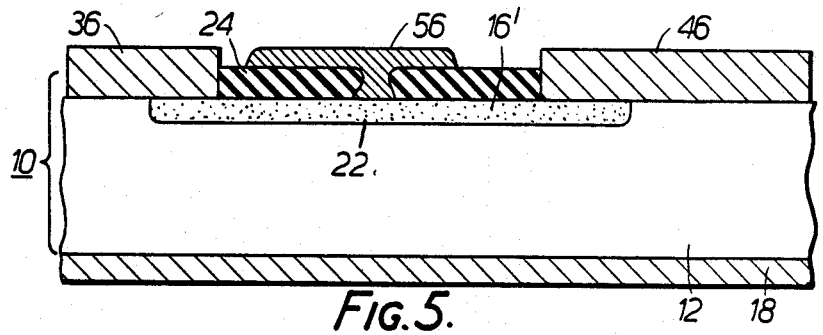

In the variant construction shown in FIGS. 4 and 5, the source, gate and drain electrodes 30,50 and 40 are of planar construction and are supported directly on a base substrate 12. Active regions 16', which provide the connective channels 22, are defined in the substrate 12 by ion implantation.

A further distinguishing feature of this variant is the form of the gate electrode 50. In this example the upper extremity of the T-section is offset relative to the lower extremity. It is offset so that the upper extremity lies closer to the source electrode 30 and further from the drain electrode 40. (The gate electrode 50, shown in FIG. 1, may also be offset in this manner.) Typical spacings between source and gate electrodes, and between gate and drain electrodes are in this case 2 and 4 microns, respectively.

We claim:

1. A travelling-wave field-effect transistor having a planar structure comprising:
   a supportive substrate of semiconductor material;
   a continuous elongate source electrode;
   a continuous elongate gate electrode; and,
   a continuous elongate drain electrode;
   said elongate electrodes all being disposed on one plane surface of said substrate;
   wherein in the substrate there is defined a plurality of discrete active sites distributed underlying and spaced apart along the length of said elongate source, gate and drain electrodes, each active site comprising a source region, a drain region and a channel region extending laterally from respective source region to respective drain region;
   the elongate drain electrode having a planar meander configuration with portions of this meander configuration lying closer to the elongate gate electrode and being located in the immediate vicinity of each said active site, the meander configuration being such that the inductance of the drain electrode allows phase matching of travelling waves on the drain and gate electrodes and provides mutual inductance between the drain and gate electrodes wherein said gate electrodes provide feedback to sustain and enhance travelling wave propagation and growth.

2. A transistor, as claimed in claim 1 wherein the source electrode, the drain electrode, or both, have protruding portions, one at each active site, said protruding portions providing a connection between said source electrode or drain electrode or both to corresponding respective source regions and drain regions.

3. A transistor, as claimed in claim 1, wherein the gate electrode is of greater cross-section at passive sites, these being sites located between the active sites aforesaid.

4. A transistor, as claimed in claim 1, wherein the gate electrode is of T-section shape at each of the active sites.

5. A transistor, as claimed in claim 4, wherein the upper extremity of each T-section is offset relative to its lower extremity, the upper extremity of the gate electrode lying closer to the source electrode than to the drain electrode.

6. A transistor, as claimed in claim 1, wherein the substrate is of III-V semiconductor material, the channels aforesaid extending beneath the base of a groove in this substrate and being comprised of epitaxially grown material.

7. A transistor, as claimed in claim 1, the substrate having ion implanted regions, which regions provide the channels aforesaid.

* * * * *